United States Patent [19]
Gowni et al.

[11] Patent Number: 5,952,868
[45] Date of Patent: Sep. 14, 1999

[54] VOLTAGE LEVEL INTERFACE CIRCUIT WITH SET-UP AND HOLD CONTROL

[75] Inventors: Shiva Gowni, Carrollton, Tex.; Purushothaman Ramakrishnan; Padma Nagaraja, both of Bangalore, India

[73] Assignee: Cypress Semiconductor Corp., San Jose, Calif.

[21] Appl. No.: 08/933,139

[22] Filed: Sep. 18, 1997

[51] Int. Cl.$^6$ .......................... H03K 19/003; H03K 5/159
[52] U.S. Cl. .......................... 327/362; 327/262; 327/333; 327/400; 326/29; 326/80; 365/189.11; 365/194
[58] Field of Search .................................. 326/21, 29, 62, 326/63, 80; 327/333, 261, 262, 263, 134, 170, 362, 379, 395, 400; 365/189.11, 194

[56] References Cited

U.S. PATENT DOCUMENTS

| | | | |
|---|---|---|---|
| 4,985,639 | 1/1991 | Renfrow et al. | 327/243 |
| 5,119,334 | 6/1992 | Fujii | 365/189.11 |
| 5,264,745 | 11/1993 | Woo | 326/21 |
| 5,389,828 | 2/1995 | Tago | 327/263 |
| 5,438,550 | 8/1995 | Kim | 365/233.5 |
| 5,600,274 | 2/1997 | Houston | 327/262 |
| 5,696,463 | 12/1997 | Kwon | 327/172 |

*Primary Examiner*—Timothy P. Callahan
*Assistant Examiner*—Terry L. Englund
*Attorney, Agent, or Firm*—Christopher P. Maiorana, P.C.

[57] ABSTRACT

The output (3) of a level shifter (1) is split into two paths (4,5) with a delay ($\tau_1$, $\tau_2$) being introduced into at least one path to enable rise delay and fall delay to be controlled independently of one another. In the context of an integrated circuit which includes a memory device, the use of an additional path allows control of the set-up and hold times in that one transition can be speeded up or slowed down independently of the other transition to achieve the best possible set-up and hold times.

16 Claims, 3 Drawing Sheets

VOLTAGE LEVEL INTERFACE CIRCUIT WITH SET-UP AND HOLD CONTROL

FIELD OF THE INVENTION

The present invention relates to voltage interface circuits which employ level shifters, and in particular, to a voltage level interface for a memory device.

BACKGROUND OF THE INVENTION

It is necessary to interface a memory device into a system. This means that the memory and the surrounding system need to have matched logic high and low levels. Common interface levels are TTL, ECL and CMOS and the memory must be designed with inputs and outputs that shift from the levels of the internal circuitry to one of these external interfaces.

In conventional level shifters, rise delay and fall delay are quite different. This is illustrated in FIG. 1 for an inverting level shifter. As shown, when an input signal to the level shifter falls from high to low the output of the level shifter rises from low to high. The respective centered trip points for the two signals for this logic transition show that there is a fall delay of around 650 ps. However, when the input level rises and the output of the level shifter falls, the rise delay is only around 25 Ps. The difference between the rise delay and the fall delay, caused by the response of the level shifter, can be a problem in digital circuits where timing is important. This is particularly true of memory circuits where the rise delay and fall delay affect setup and hold times in a memory cycle.

A conventional approach to this problem is to use a ratioed logic delay chain which is designed to minimize the difference between the rise delay and the fall delay. However, this solution changes the response by adding a delay to both level transitions so that there is an additional and unnecessary increase in the fall delay. Such a delay chain is extremely sensitive and a great deal of care needs to be taken to centered the trip points of the associated logic.

SUMMARY OF THE INVENTION

According to a first aspect of the present invention, a voltage level interface circuit comprises a voltage level shifter adapted to shift the voltage level of an input signal from one level to another, the voltage level shifter including a first output path and a second output path each of which is connected to an output device, wherein at least one of the first output path and the second output path comprises a signal delay device to introduce a differential transmission delay between signals carried by the first output path and the second output path to compensate for the response of the level shifter.

Preferably, the output device comprises a logic gate. More preferably, the output device comprises a NOR gate.

The signal delay device is used to introduce a transmission delay in at least one of the first output path and second output path. Suitable examples include a programmable delay circuit and a logic gate array. A signal delay device may be provided in each of the first output path and the second output path to provide independent control of both rise delay and the fall delay of an output signal of the interface circuit with respect to the input signal.

Preferably, the transmission delay of the signal delay device is arranged to minimize any difference between the rise delay and the fall delay of the level shifter.

According to a second aspect of the present invention, an integrated circuit comprises a voltage level interface circuit in accordance with the first aspect of the present invention.

Preferably, the integrated circuit comprises a memory device. More preferably, the memory device is a random access memory.

According to a third aspect of the present invention, a method of controlling setup and hold times in an integrated circuit comprises the steps of coupling an input signal along a first path and a second path to a logic gate, wherein a predetermined differential transmission delay is introduced between signals carried by the first path and the second path to control at least a hold time of the input signal with respect to an associated control signal of the integrated circuit.

Preferably, a transmission delay for each of the first path and the second path is controlled to provide independent control of both setup and hold times.

Preferably, the logic gate is a latch.

In the present invention, the output of a level shifter is split into two paths with a delay being introduced into at least one path to enable rise delay and fall delay to be controlled independently of one another. In the context of an integrated circuit which includes a memory device, the use of an additional path allows control of the setup and hold times in that one transition can be speeded up or slowed down independently of the other transition. Accordingly, the best possible setup and hold times can be achieved.

BRIEF DESCRIPTION OF DRAWINGS

Examples of the present invention will now be described with reference to the accompanying drawings, in which.

DETAILED DESCRIPTION

Figure 1:
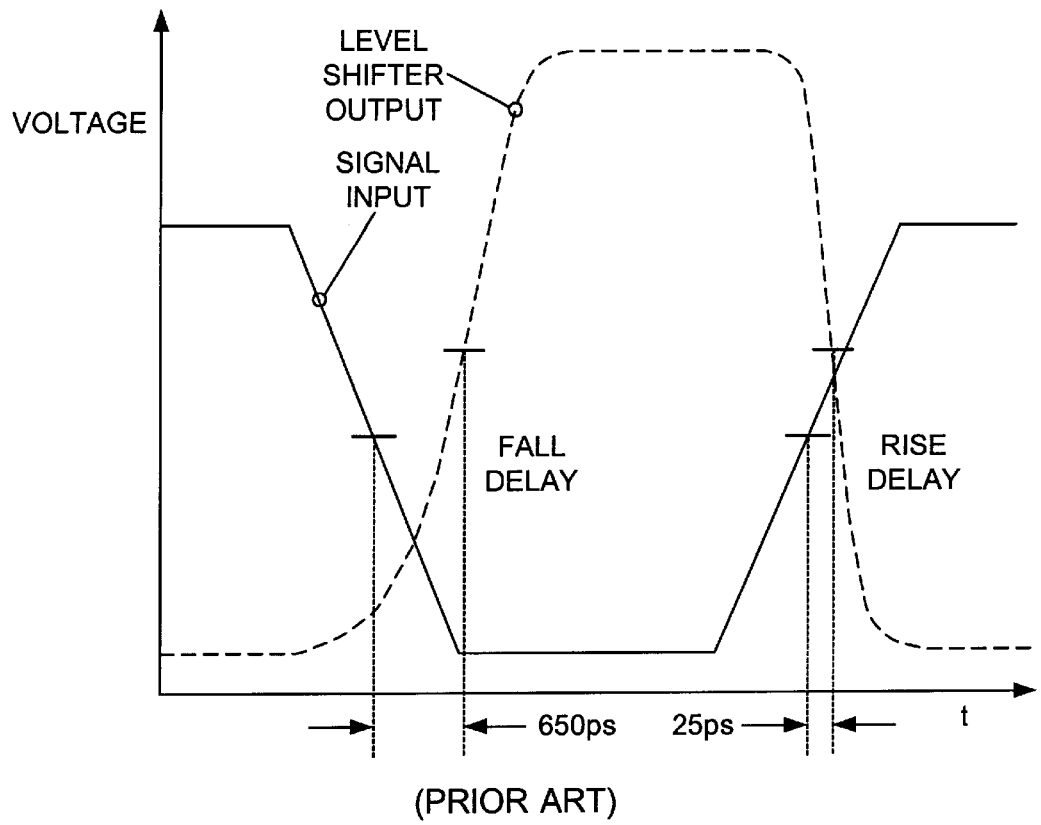
FIG. 1 illustrates rise delay and fall delay for a conventional level shifter.
Figure 2:
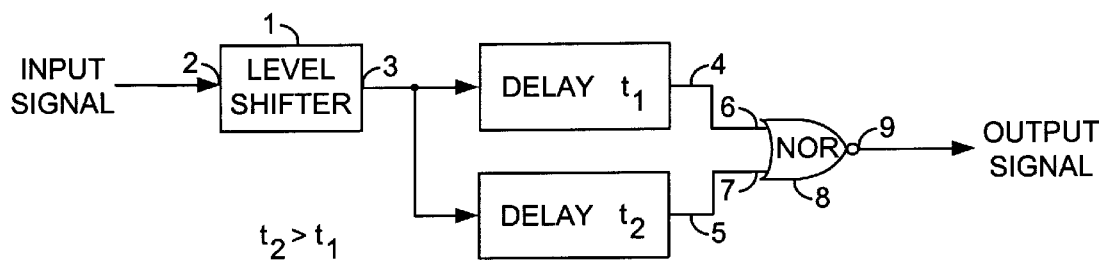
FIG. 2 is a block diagram of an example of a voltage level interface circuit in accordance with the present invention.

In FIG. 2, a voltage level interface circuit comprises a level shifter 1 having an input 2 and an output 3. The output 3 of the level shifter is split into a first path 4 and a second path 5, each of which is coupled to a respective input port 6,7 of a NOR gate 8. A signal at the output 9 of the NOR gate 8 is high whenever both inputs 6 and 7 are low.

Figure 3:
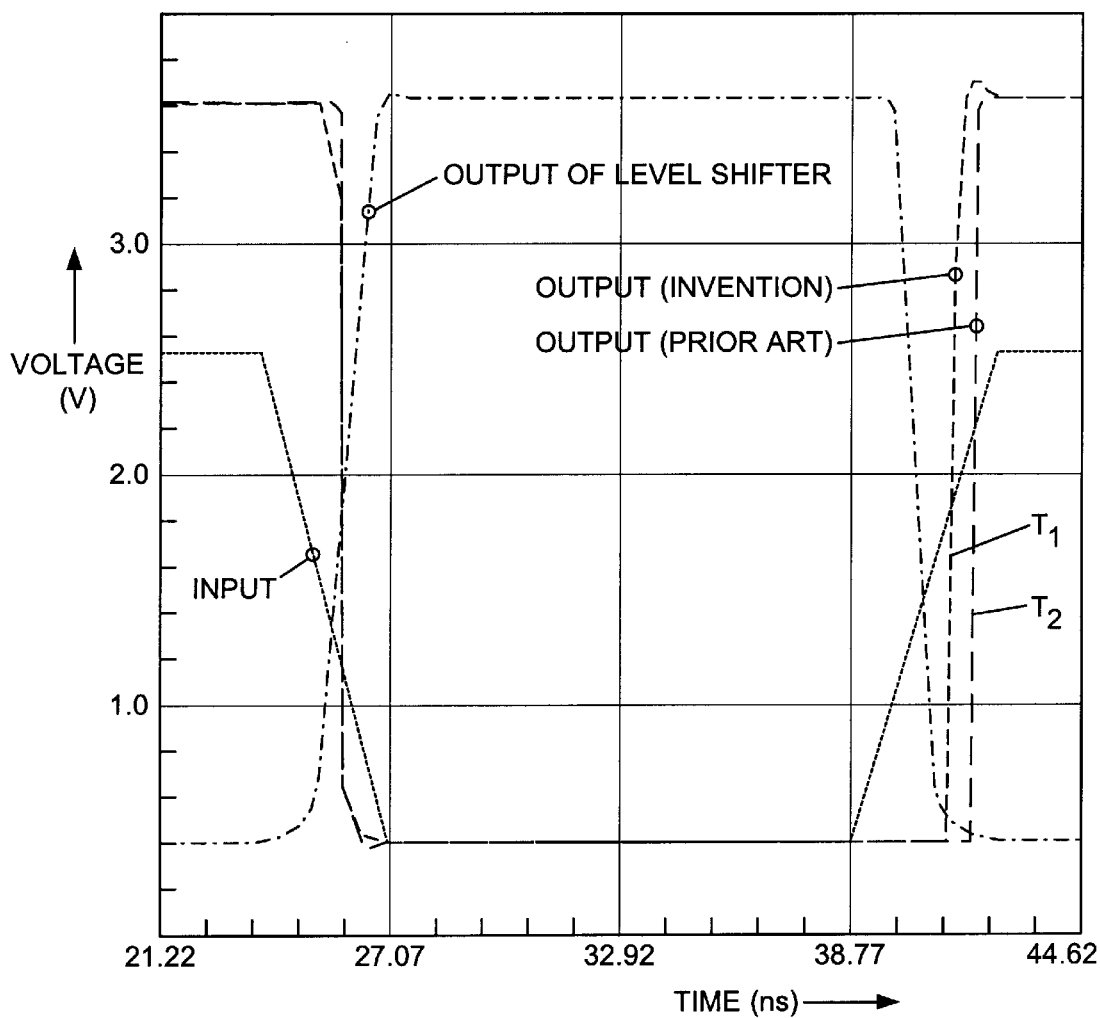
FIG. 3 illustrates the response of the circuit shown in FIG. 2.

The performance of the voltage interface circuit of FIG. 2 is shown in detail in FIG. 3. Trace T1 represents the signal which appears at the output 9 of the NOR gate 8. Although the level shifter 1 in this example is inverting, the performance would be the same for a non-inverting level shifter. As shown, the falling edge of the input signal is relatively slow and the fall delay of the level shifter is around 650 ps.

The transmission delay associated with the first path 4 (which may be substantially zero) is less than that in the second path 5 and therefore as soon as the signal level at the input 6 to the NOR gate 8 rises beyond the trip point (2.2 volts in this example) the output 9 of the NOR gate 8 goes low. The signal T1 which appears at the output 9 of the NOR gate 8 has a fall delay of around 700 ps with respect to the input signal.

When the input signal next rises the level shifter 1 responds relatively quickly in comparison to the falling transition. However, by adjusting the transmission delay in the second path 5, this can be substantially compensated for. In particular, a transmission delay in the second path 5 is controlled to match as closely as possible the delay associated with the falling transition of the input signal.

When the output of the level shifter 1 drops, the signal at the first input 6 of the NOR gate 8 goes low. However, the transmission delay introduced by the second path 5 causes the second input 7 of the NOR gate 8 to go low some time later. Only when both inputs 6 and 7 to the NOR gate 8 are low can the output 9 go high. As is shown by the trace T1 in FIG. 3, the rise delay for the signal at the output 9 of the NOR gate 8 is around 675 ps, and therefore substantially the same as the fall delay.

Trace T2 shows the output of a conventional circuit (not shown) which uses a ratioed logic delay chain to increase the rise delay to an acceptable level. However, as mentioned above, it is not possible to adjust the rise delay without affecting adversely the fall delay. In this example, although the fall delay is the same, the rise delay is around 1.2 ns which is substantially longer than in the present invention.

Figure 4:
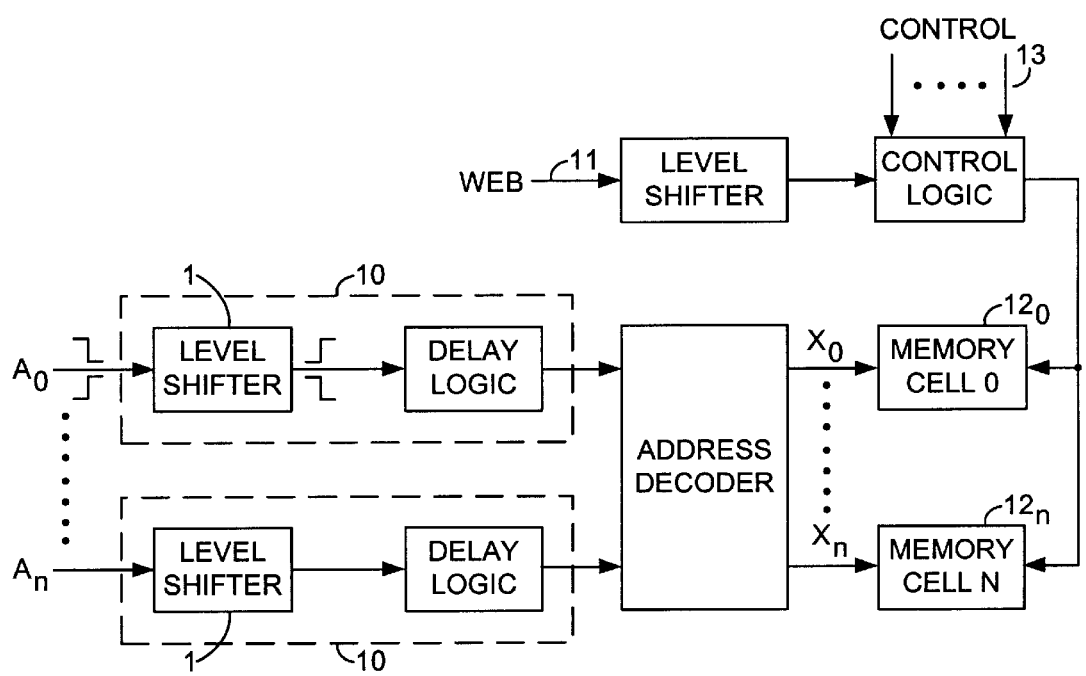
FIG. 4 shows an example of the present invention implemented within a memory device.

FIG. 4 shows part of a semiconductor memory device which includes a number of voltage level interface circuits in accordance with the present invention. The general form of this semiconductor memory device is one which is known to the person skilled in the art and therefore will not be described in detail.

In this example, when the write enable input 11 WEB is low data can be written to a memory cell 12 selected by the appropriate control signals 13. As discussed in detail above, when the output of a level shifter 1 goes high the transition is relatively slow compared to when the output of the level shifter 1 goes low. Accordingly, when Address A0 switches from logic high to logic low, memory cell N is deselected and memory cell 0 is selected, each with a certain delay. When Address A0 switches from logic low to logic high, memory cell N is selected and memory cell 0 is deselected. However, this transition is relatively fast because of the response of the level shifter 1. Hence, in the absence of the voltage level interface circuit 10 of the present invention, this circuit response could provide insufficient time to allow completion of a write in memory cell 0 because it is deselected too early. Additionally, or alternatively, it could lead to accidental writing to memory cell N because this memory cell is selected before the write operation ends. The voltage level circuit 10 of the present invention overcomes this since, as described in detail above the hold time can be adjusted to optimize the performance of the circuit. In contrast, in the conventional technique referred to in the introduction which uses ratioed logic chains, both falling and rising transitions of the output of the level shifter are slowed down so that the step of selecting memory cell 0 is unnecessarily delayed. This can lead to insufficient time being available for writing to the memory cell. This set-up time problem is not one which affects the circuit shown in FIG. 4 since control of hold time does not affect set-up times.

We claim:

1. A circuit comprising:
    voltage level shifter configured to present a shifted input signal in response to an input signal, wherein said shifted input signal has a larger voltage swing than said input signal;
    a first output path comprising a first signal delay device connected between said shifted input signal and an output device;
    a second output path comprising a second signal delay device connected between said shifted input signal and said output device, said output device configured to generate an output signal in response to said first and said second output paths, wherein the first signal delay device and the second signal delay device are configured to introduce a differential transmission delay to compensate for the response of the level shifter.

2. The circuit according to claim 1, wherein the output device comprises a logic gate.

3. The circuit according to claim 2, wherein the output device comprises a NOR gate.

4. The circuit according to claim 1, wherein said first and second signal delay devices provide independent control of both rise delay and fall delay of said output signal with respect to the input signal.

5. The circuit according to claim 1, wherein at least one of said first and second signal delay devices is a programmable delay circuit.

6. The circuit according to claim 1, wherein the transmission delay of at least one of said first and second signal delay devices is configured to minimize any difference between the rise delay and the fall delay of the output signal.

7. An integrated circuit comprising the circuit according to claim 1.

8. The integrated circuit according to claim 7, further comprising a memory device.

9. The integrated circuit according to claim 8, wherein the memory device is a random access memory.

10. The circuit according to claim 1, wherein said first signal delay device and said second signal device introduce different delays.

11. A method of controlling set-up and hold times in an integrated circuit comprising the steps of:
    shifting a voltage level of an input signal to generate a shifted input signal having a larger voltage swing than said input signal;
    coupling said shifted input signal along a first path having a first delay and a second path having a second delay to a logic gate, wherein a predetermined differential transmission delay is introduced between signals carried by the first path and the second path to control at least a hold time of the shifted input signal with respect to an associated control signal of the integrated circuit.

12. The method according to claim 11, wherein said delay for each of the first path and the second path is controlled to provide independent control of both set-up and hold times.

13. The method according to claim 11, wherein the logic gate is a latch.

14. The method according to claim 11, wherein said first delay and said second delay are different.

15. A circuit comprising:
    means for generating a shifted input signal in response to an input signal, wherein said shifted input signal has a larger swing than said input signal;
    first means for connecting said shifted input signal to an output device through a first delay; and
    second means for connecting said shifted input signal to said output device through a second delay, said output device configured to generate an output signal in response to said first and said second connecting means, wherein said first and second delays are configured to introduce a differential transmission delay to compensate for the response of the generating means.

16. The circuit according to claim 15, wherein said first delay and said second delay are different.

* * * * *